United States Patent
Ma et al.

(10) Patent No.: US 11,515,895 B2
(45) Date of Patent: Nov. 29, 2022

(54) BLOCK CODE ENCODING AND DECODING METHODS, AND APPARATUS THEREFOR

(71) Applicant: SUN YAT-SEN UNIVERSITY, Guangdong (CN)

(72) Inventors: Xiao Ma, Guangzhou (CN); Suihua Cai, Guangzhou (CN)

(*) Notice: Subject to any disclaimer, the term of this patent is extended or adjusted under 35 U.S.C. 154(b) by 0 days.

(21) Appl. No.: 17/334,806

(22) Filed: May 31, 2021

(65) Prior Publication Data
US 2022/0337269 A1    Oct. 20, 2022

(30) Foreign Application Priority Data
Mar. 31, 2021  (CN) .......................... 202110351850.6

(51) Int. Cl.
  *H03M 13/13*     (2006.01)
  *H03M 13/39*     (2006.01)
  *H04L 1/00*      (2006.01)

(52) U.S. Cl.
  CPC ......... *H03M 13/132* (2013.01); *H03M 13/13* (2013.01); *H03M 13/3905* (2013.01); *H03M 13/3944* (2013.01); *H04L 1/0054* (2013.01); *H04L 1/0057* (2013.01)

(58) Field of Classification Search
  CPC .................................................. H03M 13/132
  See application file for complete search history.

(56) References Cited

U.S. PATENT DOCUMENTS

2005/0210357 A1* 9/2005 Piret .................... H03M 13/132
                                                    714/752
2017/0104590 A1* 4/2017 Wang ...................... H04L 9/304

FOREIGN PATENT DOCUMENTS

FR        2865083 A1 *  7/2005  ......... H03M 13/132

OTHER PUBLICATIONS

Suihua Cai, Xiao Ma; "Twisted-Pair Superposition Transmission"; IEEE Transactions on Communications, vol. 69, No. 9, Sep. 2021; pp. 5663-5671 (Year: 2021).*

* cited by examiner

Primary Examiner — Joseph D Torres
(74) Attorney, Agent, or Firm — JMB Davis Ben-David

(57) ABSTRACT

The present disclosure discloses a new coding scheme, which is constructed by superimposing together a pair of basic codes in a twisted manner. A SCL decoding algorithm is proposed for the TPST codes, which may be early terminated by a preset threshold on the empirical divergence functions (EDF) to trade off performance with decoding complexity. The SCL decoding of TPST is based on the efficient list decoding of the basic codes, where the correct candidate codeword in the decoding list is distinguished by employing a typicality-based statistical learning aided decoding algorithm. Lower bounds for the two layers of TPST are derived, which may be used to predict the decoding performance and to show the near-ML performance of the proposed SCL decoding algorithm. The construction of TPST codes may be generalised by allowing different basic codes for the two layers.

14 Claims, 5 Drawing Sheets

BLOCK CODE ENCODING AND DECODING METHODS, AND APPARATUS THEREFOR

CROSS-REFERENCE TO RELATED APPLICATIONS

Benefit is claimed to Chinese Patent Application No. 202110351850.6, filed Mar. 31, 2021, the contents of which are incorporated by reference herein in their entirety.

FIELD

This application relates to the technical field of channel coding, in particular, the field of block code encoding and decoding.

BACKGROUND

With the development and advancement of modern communications, Ultra-Reliable Low Latency Communication (URLLC), which is one of the key pillars in the 5G network, has attracted increasingly more attention. To meet the stringent requirements of low latency, channel codes for URLLC are designed for short block length, for example with length, n<1000.

Several bounds on achievable rate in the finite length regime had been investigated and presented in theory. For example, given a block length n and error probability ε, a coding rate $$R = \frac{\log M}{n}$$

is achievable if there exists a codebook with M codewords and a decoder whose frame error rate (FER) is smaller than ε. It was proven that, given (n; M), there exist a code with the FER ε is upper bounded by the random coding union (RCU) bound and lower bounded by the meta-converse (MC) bound. To approach the performance bounds, coding schemes tailored to the transmission of short blocks were investigated, where BCH codes, tail-biting convolutional codes (TBCCs), polar codes, and low-density parity-check (LDPC) codes are compared and shown to be potentially applicable for low latency communications. List decoding algorithms such as order statistic decoding (OSD) may be used to attain a near-ML performance for codes such as BCH codes and Reed-Muller codes with length n≤128.

Another example of known efficient list decoding algorithms is the list Viterbi algorithm (LVA) for trellis codes such as TBCCs, which generates a list of candidate codewords associated with the highest likelihoods. It was shown that, TBCCs with a large encoding memory perform as well as the best-known block codes with short and medium length. However, the decoding suffers from a high decoding complexity due to the enormous amount of states. To reduce the decoding complexity, the wrap-around Viterbi algorithm (WAVA) for TBCC was proposed. In another way, TBCCs are designed by concatenating with cyclic redundancy checks (CRCs), where the outer concatenated CRC can be viewed as an error detector for identifying the correct candidate codeword in the decoding list.

Polar code was proposed in 2009, which is proved to achieve the channel capacity at infinite length with successive cancelation (SC) decoding. Based on the tensor network representation of polar codes, branching multi-scale entanglement renormalization ansatz (BMERA) code was proposed to improve the SC decoding performance. Similar to TBCCs, polar codes are designed with CRC precoding and decoded by the successive cancellation list (SCL) decoding algorithm. In a new polar code construction, CRC precoding may be replaced by rate-one convolutional precoding. The performance is further improved to approach the RCU bound by sequential decoding of the PAC codes. From the perspective of polar coding with dynamically frozen bits, the list decoding algorithm of PAC codes was investigated, which is shown to closely match the performance of the sequential decoder.

Among the above coding schemes, the BCH codes decoded by the OSD and the TBCC with a larger memory length have better performance, but they require extremely high algorithm complexity. In addition, for the design of short codes, TBCC and Polar codes need to use CRC as the outer code to assist their list decoding. On the one hand, the use of CRC increases the redundancy of the coding, thereby reducing the coding rate. On the other hand, it is necessary to optimize the design with CRC, which makes the coding structure inflexible.

This disclosure proposes alternatives to known methods.

SUMMARY OF THE DISCLOSURE

The present disclosure aims to provide block code encoding and decoding methods, and apparatus therefor.

A coding scheme called twisted-pair superposition transmission (TPST) is proposed, which is constructed by superimposing together a pair of basic codes in a twisted manner. An SCL decoding algorithm is proposed for the TPST codes, which may be early terminated by a preset threshold on the empirical divergence functions (EDF) to trade off performance with decoding complexity. The SCL decoding of TPST is based on the efficient list decoding of the basic codes, where the correct candidate codeword in the decoding list is distinguished by employing a statistical learning aided decoding algorithm. Lower bounds for the two layers of TPST are derived, which may be used to predict the decoding performance and to show the near-ML performance of the proposed SCL decoding algorithm. The construction of TPST codes may be generalized by allowing different basic codes for the two layers. In addition to the partial superposition method presented, another design approach, referred to as the rate allocation method, is presented along with a procedure to search TPST codes with good performance within an SNR region of interest. Numerical simulation results show that, the constructed TPST codes have performance close to the RCU bound in the short length regime.

Compared to known methods, the proposed method herein uses the method of coupling short component codes to construct the code. By bi-directionally superimposing the two component codewords, it replaces the CRC (cyclic redundancy check) that will cause the code rate loss, making the code rate structure flexible and without information bits. Combining with the list decoding of component codes, better performance may be obtained under the condition of lower complexity.

In a first aspect of the present disclosure, there is provided an encoding method to encode a block code with a code length of n and an information bit length of k, the method comprising: using component codes $C_0[n_0,k_0]$ and $C_1[n_1,k_1]$ to indicate two block codes with code lengths $n_0$ and $n_1$ respectively, and information bit lengths $k_0$ and $k_1$ respectively such that $n_0+n_1=n$, $k_0+k_1=k$; and encoding an information sequence $u=(u^{(0)}, u^{(1)})$ of length k into a codeword sequence c of length n, where $u^{(0)}$ and $u^{(1)}$ are sub-sequences of u of length $k_0$ and $k_1$ respectively, and correspond to an upper layer and a lower layer of encoding respectively; the encoding comprising the following steps: using the component code $C_0[n_0,k_0]$ to encode the upper layer $u^{(0)}$ into an upper layer component codeword $v^{(0)}$ of length $n_0$, and using the component code $C_1[n_1,k_1]$ to encode the lower layer $u^{(1)}$ into a lower component codeword $v^{(1)}$ of length $n_1$; coupling the upper layer $u^{(0)}$ into the lower layer component codeword $v^{(1)}$ by superposition to obtain a sequence $c^{(1)}$ of length $n_1$: $c^{(1)}=S(u^{(0)}+v^{(1)})$, wherein S is a coupling function; obtaining a sequence w with a length of $n_0$ by passing through the sequence $c^{(1)}$ through a partial sampler $\Pi$: $w=c^{(1)}\Pi$, wherein $\Pi$ is a $n_1 \times n_0$ binary matrix, each column of which has weight of no more than 1; superimposing by XOR to obtain a sequence $c^{(0)}$ of length $n_0$: $c^{(0)}=v^{(0)}+w$; and outputting the codeword sequence $c=(c^{(0)}, c^{(1)})$ of length n.

In one form, the coupling function S is selected such that a small change in $u^{(0)}$ causes a significant change in $c^{(1)}$. In one form, the coupling function S is a random binary matrix $R_u$ of size $k_0 \times n_1$, such that $c^{(1)}=u^{(0)}R_u+v^{(1)}$. In one form, the coupling function S is a random binary matrix $R_v$ of size $n_0 \times n_1$, such that $c^{(1)}=v^{(0)}R_v+v^{(1)}$. In one form, the coupling function S is provided as follow: using a polar code as a component code for the lower layer, and use a binary matrix P with a size of $k_0 \times (n_1-k_1)$ and each column of which has weight of no more than 1, to obtain a sequence of length $n_1-k_1$: $f=u^{(0)}P$, so that $c^{(1)}$ is a polar codeword with f as frozen bits of the lower layer and $u^{(1)}$ as information bits.

In a second aspect of the present disclosure, there is provided a decoding method for decoding a received sequence encoded using the method of claim 1, with an input being a probability sequence $y=(y^{(0)}, y^{(1)})$ with each bit of the received sequence of length n equals to 0, and an output being an estimated transmitted information sequence it, the method comprising the following steps: calculating a probability sequence $\tilde{y}^{(0)}$ of an upper layer component code according to a superposition relationship of a partial sampler $\Pi$; using $\tilde{y}^{(0)}$ as an input, calling a list decoding algorithm of a component code $C_0[n_0,k_0]$ with a list size of L, and obtaining L candidate information sequences $\hat{u}_l^{(0)}$ and their corresponding component codeword sequence $\hat{v}_l^{(0)}$ of length $n_0$, l=0, 1, . . . , L−1; for l=0, 1, . . . L−1: calculating a probability sequence $\tilde{y}_l^{(1)}$ of a lower layer component code according to $\Pi$; using $\tilde{y}_l^{(1)}$ as an input, eliminating an influence of the upper layer component code, and decoding the lower layer component code $C_1[n_1,k_1]$ according to the coupling function S to obtain $\hat{u}_l^{(1)}$; obtaining a candidate information sequence $\hat{u}_l=(\hat{u}_l^{(0)}, \hat{u}_l^{(1)})$; and calculating a likelihood function of each candidate information sequence, and outputting the candidate information sequence with the maximum likelihood.

In one form, for the probability sequence $\tilde{y}^{(0)}$ of the upper layer component code, the i-th component of $\tilde{y}_i^{(0)}$, i=0, 1, . . . , $n_0-1$ is calculated as follows: if the weight of the i-th column of $\Pi$ is 0, then $\tilde{y}_i^{(0)}=y_i^{(0)}$, if the weight of the i-th column of H is 1, and the position of 1 is in line j, that is, $\Pi_{ji}=1$, then $\tilde{y}_i^{(0)}=y_i^{(0)}y_j^{(1)}+(1-y_i^{(0)})(1-y_j^{(1)})$, where $y_i^{(0)}$ represents the i-th component of $y^{(0)}$, and $y_j^{(1)}$ represents weights of the j-th component of $y^{(1)}$.

In one form, for the probability sequence $\tilde{y}_l^{(1)}$ of the lower layer component code, the i-th component $\tilde{y}_{l,i}^{(1)}$, i=0, 1, . . . , $n_1-1$ is calculated as follows: if the weight of the i-th row of $\Pi$ is 0, then $\tilde{y}_{l,i}^{(1)}=y_i^{(1)}$; if the weight of the i-th row of $\Pi$ is $\rho_i > 0$, that is, it has $\rho_i$ positions as 1, and these positions are $j_0, j_1, \ldots, j_{\rho_i-1}$, then $$\hat{y}_{l,i}^{(1)} = y_i^{(1)} \boxplus D_{l,j_0} \boxplus \ldots \boxplus D_{l,j_{\rho_i-1}},$$

wherein, $$D_{l,j} = \begin{cases} y_j^{(0)}, & \hat{u}_{l,j}^{(0)} = 0 \\ 1 - y_j^{(0)}, & \hat{u}_{l,j}^{(0)} = 1 \end{cases},$$

$\hat{u}_{l,j}^{(0)}$ represents the j-th component of $\hat{u}_l^{(0)}$, and wherein the operation $\boxplus$ is defined as:

$$a \boxplus b = \frac{ab}{ab + (1-a)(1-b)}.$$

In one form, based on the coupling function S, the influence of the upper layer component code is eliminated, and the calculation method for decoding the lower layer component code $C_1[n_1,k_1]$ is: substituting $\hat{u}_l^{(0)}$ into the coupling function S to obtain a sequence $s_l = S(\hat{u}_l^{(0)})$, and correcting $\tilde{y}_l^{(1)}$ according to $s_l$ to obtain $\hat{y}_l^{(1)}$:

$$\hat{y}_{l,j}^{(1)} = \begin{cases} \tilde{y}_{l,j}^{(1)}, & s_{l,j} = 0 \\ 1 - \tilde{y}_{l,j}^{(1)}, & s_{l,j} = 1 \end{cases},$$

wherein $\hat{y}_{l,j}^{(1)}, \tilde{y}_{l,j}^{(1)}, s_{l,j}$ represent the j-th component of $\hat{y}_l^{(1)}$, $\tilde{y}_l^{(1)}$, $s_l$ respectively; using the calculated $\hat{y}_l^{(1)}$ as the component code $C_1[n_1,k_1]$ of the called lower layer for decoding to obtain $\hat{u}_l^{(1)}$.

In one form, the calculation method for calculating the likelihood function of each candidate information sequence is: re-encoding each candidate information sequence $\hat{u}_l$ to obtain an estimated codeword $\hat{c}_l$ to calculate its likelihood function $\lambda(\hat{c}_l)=\Pi_{i=0}^{n-1}[y_i+\hat{c}_{l,i}(1-2y_i)]$, where $y_i$ and $\hat{c}_{l,i}$ represent the i-th component of y and $\hat{c}_l$ respectively.

In one form, the candidate information sequence with the maximum likelihood is used as the output, and the decoding complexity is reduced by setting a threshold T, and when the calculated likelihood function exceeds the threshold, outputting $\hat{u}=\hat{u}_l$ then terminating the decoding process.

In one form, when the coupling function S is provided by using a polar code as a component code for the lower layer, and use a binary matrix P with a size of $k_0 \times (n_1-k_1)$ and a column weight of no more than 1, to obtain a sequence of length $n_1-k_1$: $f=u^{(0)}P$, so that $c^{(1)}$ is a polar codeword with f as frozen bits of the lower layer and $u^{(1)}$ as information bits; the step of decoding the lower layer component code $C_1[n_1, k_1]$ is simplified to: calculating frozen bits $f_l=\hat{u}_l^{(0)}P$, and then calling the decoder of the polar code $C_1[n_1, k_1]$ with $f_l$ as the frozen bits to decode to obtain $\hat{u}_l^{(1)}$.

In another aspect of the present disclosure, there is provided an apparatus comprising a memory, a processor, and a computer program stored on the memory capable of running on the processor, characterized in that, the processor executes the computer program to implement the steps of the method of any one of the first and the second aspects, and their various forms.

In another aspect of the present disclosure, there is provided a computer-readable medium with non-volatile program code executable by a processor, characterized in that, the program code causes the processor to execute the method according to any one of the first and the second aspects, and their various forms.

The present disclosure offers one or both of the following advantages:
  (a) Encoding is carried out without a need to construct a specific CRC. Different from the existing encoding structure based on CRC technology, the encoding parameters are determined by the component code parameters of the upper and lower layers. The code length and rate structure are also flexible.
  (b) Its short code length is with decoding algorithm of lower complexity and higher performance. Different from the existing CRC-assisted list decoding algorithm, the present disclosure is based on the coupling structure of upper and lower layer codes, and uses the likelihood value of the overall codeword to identify the candidate codewords output by decoding the list of upper layer component codes.

Other features and advantages of the present disclosure will be described in the following description, and partly become clear from the disclosure, or understood by implementing the present disclosure. The purpose and other advantages of the disclosure are realized and obtained by the structures specifically pointed out in the description, claims and figures.

In order to make the above-mentioned objectives, features and advantages of the present disclosure clearer and understandable, the preferred embodiments and accompanying figures are described in detail as follows.

DESCRIPTION OF THE FIGURES

In order to more clearly illustrate the specific embodiments of the disclosure or the technical solutions in the prior art, the following will briefly introduce the figures that need to be used in the description of the specific embodiments or the prior art. Obviously, the figures in the following description are some embodiments of the present disclosure. For those of ordinary skill in the art, other figures may be obtained based on these figures without any inventive work.

DESCRIPTION

In order to make the purpose, technical solutions and advantages of the embodiments of this application clearer, the technical solutions of this application will be described clearly and completely in conjunction with the accompanying figures. Obviously, the described embodiments are part of the embodiments of this application, not all of the embodiments. Based on the embodiments in this application, all other embodiments obtained by those of ordinary skill in the art without inventive work shall fall within the protection scope of this application.

Figure 1:
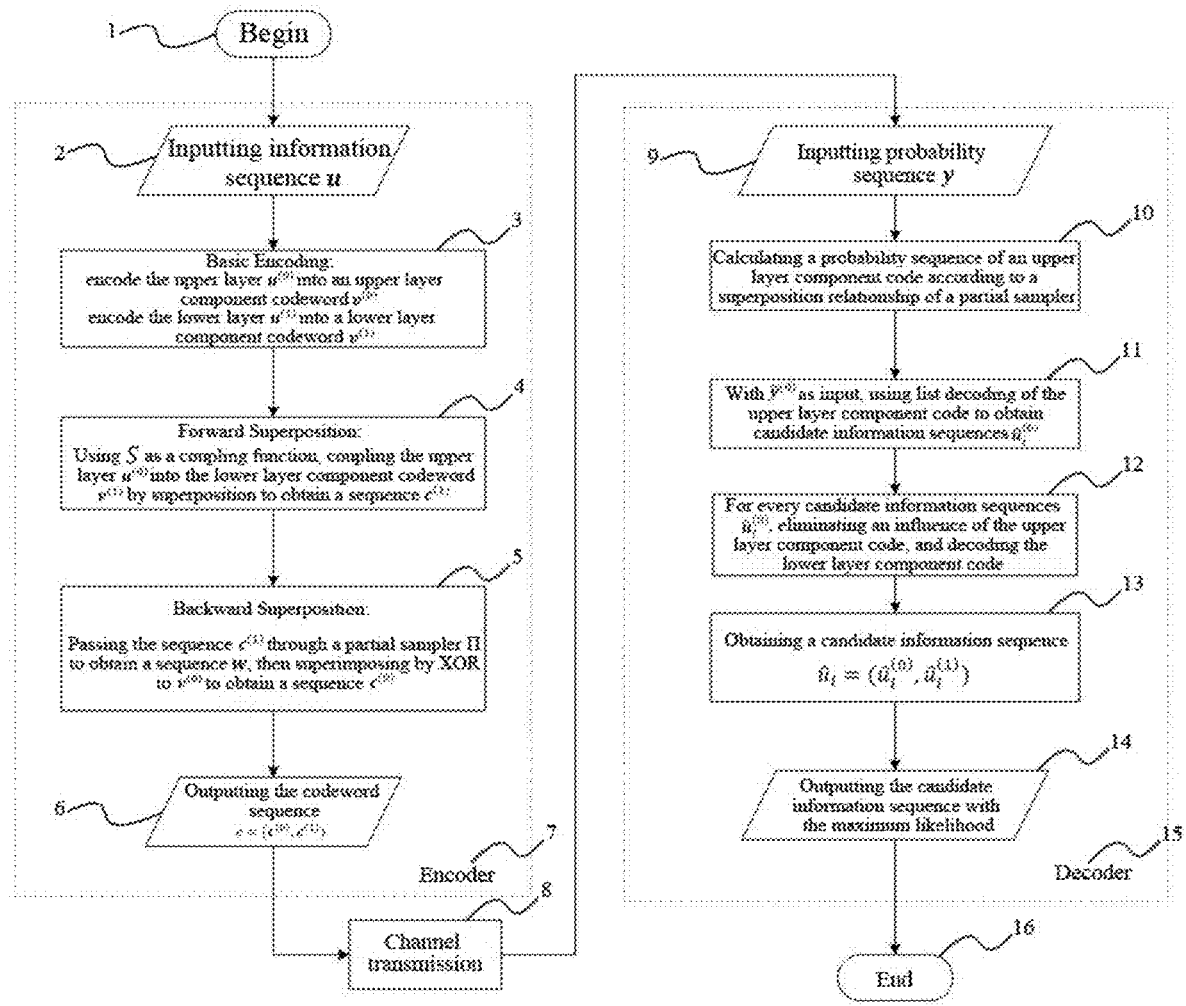
FIG. 1 shows an encoding and decoding flow chart according to one embodiment of the present disclosure.

FIG. 1 shows an encoding and decoding flow chart according to one embodiment of the present disclosure.

By coupling the component codes to encoding and decoding, a good code with flexible and adjustable parameters is designed, and its performance is close to the limited code length and capacity limit, and its low complexity decoding algorithm is given.

In this embodiment of FIG. 1, the encoder 7 is connected to a decoder 15 through a channel transmission 8. The channel transmission may take many forms, for example, wired or wireless transmission using various transmission protocols, as long as the encoded information may be sent from the encoder 7 to the decoder 15.

When the process begins 1, the step of inputting an information sequence u is performed. This is followed by a basic encoding step 3. During this step 3, two steps are performed: (a) encode a upper layer $u^{(0)}$ into an upper layer component codeword $v^{(0)}$; and (b) encode a lower layer $u^{(1)}$ into a lower component codeword $v^{(1)}$. More details of step 3 will be discussed in later sections.

A forward superposition step 4 follows the step 3 above. In this step 4, using S as a coupling function, the upper layer $u^{(0)}$ is coupled into the lower layer component codeword $v^{(1)}$ by superposition to obtain a sequence $c^{(1)}$. More details of step 4 will be discussed in later sections.

A backward superposition step 5 follows the step 4 above. In this step 5, the sequence $c^{(1)}$ is passed through a partial sampler Π to obtain a sequence w, then by superimposing by XOR to $v^{(0)}$, a sequence $c^{(0)}$ is obtained. The next step 6 is to output a codeword sequence $c=(c^{(0)}, c^{(1)})$. The codeword sequence is then sent through a channel indicated by channel transmission 8.

On the side of decoder 15, the decoder receives the transmission from encoder 7. The decoder 15 performs the following steps: first, Inputting probability sequence y 9; followed by calculating a probability sequence of an upper layer component code according to a superposition relationship of a partial sampler 10; then with $\hat{y}^{(0)}$ as input, using list decoding of the upper layer component code to obtain candidate information sequences $\hat{u}_l^{(0)}$ 11; and For every candidate information sequences $\hat{u}_l^{(0)}$, eliminating an influence of the upper layer component code, and decoding the lower layer component code 12; then finally obtaining a candidate information sequence $\hat{u}_l=(\hat{u}_l^{(0)}, \hat{u}_l^{(1)})$ 13, and outputting the candidate information sequence with the maximum likelihood 14. The entire encoding and decoding process then end 16.

Figure 2:
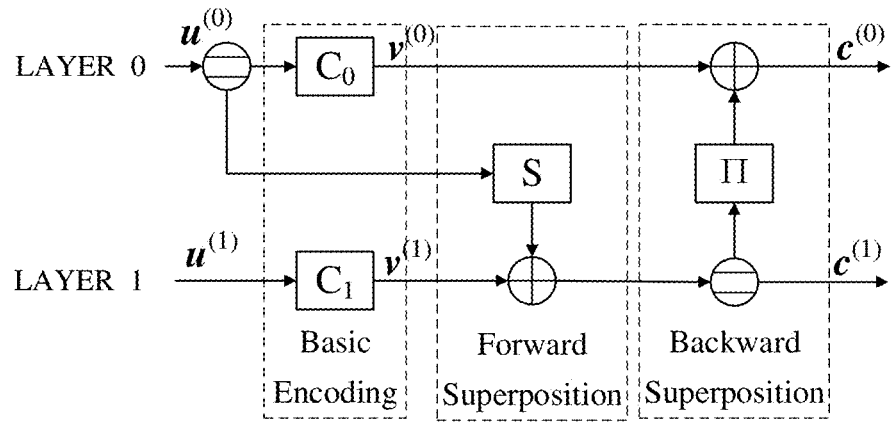
FIG. 2 shows a coding block diagram according to one embodiment of the present disclosure.

Referring to FIG. 2, this embodiment shows an encoding embodiment using a block code with a code length of n and an information bit length of k as an example. As shown in the figure, there are two layers, an upper layer, layer 0, and an lower layer, layer 1. The aim is to encoding an information sequence $u=(u^{(0)}, u^{(1)})$ of length k into a codeword sequence c of length n, where $c=(c^{(0)}, c^{(1)})$. The $C_0$ and $C_1$ indicates two block codes with code lengths $n_0$ and $n_1$ respectively, and are $C_0[n_0, k_0]$ and $C_1[n_i, k_1]$ respectively where $n_0+n_1=n$, $k_0+k_1=k$, and $u^{(0)}$ and $u^{(1)}$ are sub-sequences of u of length $k_0$ and $k_1$ respectively, and correspond to an upper layer and a lower layer of encoding respectively. The encoding process comprising the following steps: using the component code $C_0[n_0, k_0]$ to encode the upper layer $u^{(0)}$ into an upper layer component codeword $v^{(0)}$ of length $n_0$, and using the component code $C_1[n_1, k_1]$ to encode the lower layer $u^{(1)}$ into a lower component codeword $v^{(1)}$ of length $n_1$; coupling the upper layer $u^{(0)}$ into the lower layer component codeword $v^{(1)}$ by superposition to obtain a sequence $c^{(1)}$ of length $n_1$: $c^{(1)}=S(u^{(0)})+v^{(1)}$, wherein S is a coupling function; obtaining a sequence w with a length of $n_0$ by passing through the sequence $c^{(1)}$ through a partial sampler $\Pi$: $w=c^{(1)}\Pi$, wherein $\Pi$ is a $n_1 \times n_0$ binary matrix, each column of which has weight of no more than 1; superimposing by XOR to obtain a sequence $c^{(0)}$ of length $n_0$: $c^{(0)}=v^{(0)}+w$; and outputting the codeword sequence $c=(c^{(0)}, c^{(1)})$ of length n.

Figure 3:
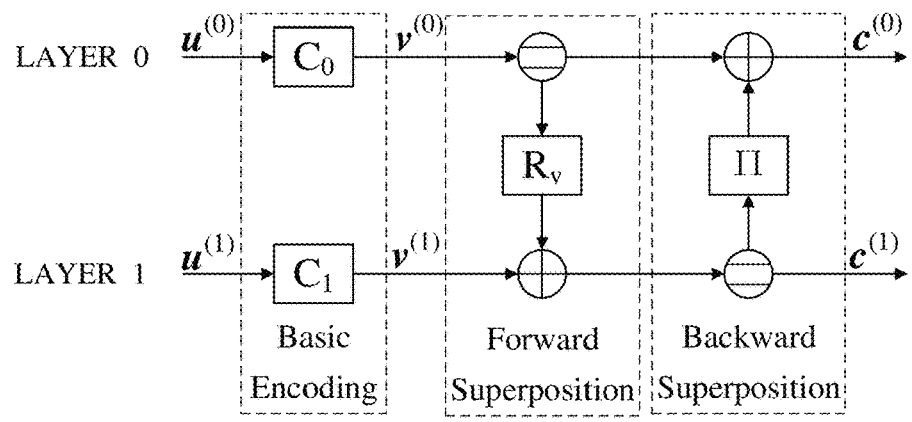
FIG. 3 shows a corresponding coding block diagram according to one embodiment of the present disclosure.

Referring to FIG. 3, this embodiment is similar to the embodiment of FIG. 2, except that the S coupling function takes a different form. In this embodiment, the coupling function S takes a form of a random binary matrix $R_v$ of size $n_0 \times n_1$, such that $c^{(1)}=v^{(0)}R_v+v^{(1)}$.

Figure 4:
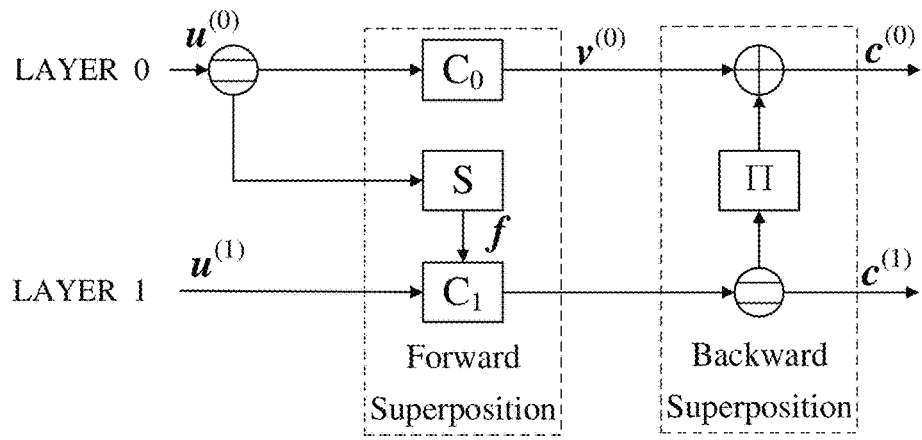
FIG. 4 shows a corresponding coding block diagram according to one embodiment of the present disclosure.

Referring to FIG. 4, this embodiment is similar to the embodiment of FIG. 2, except that the S coupling function takes another different form. In this embodiment, the coupling function S is provided as follow: using a polar code as a component code for the lower layer, and use a binary matrix P with a size of $k_0 \times (n_1-k_1)$ and each column of which has weight of no more than 1, to obtain a sequence of length $n_1-k_1$: $f=u^{(0)}P$, so that $c^{(1)}$ is a polar codeword with f as frozen bits of the lower layer and $u^{(1)}$ as information bits.

Encoding and decoding will be further elaborated below with reference to certain examples. However, unless specifically stated, none of the features of the examples are limiting.

For encoding, let $F_2$ be the binary field. Let $C_0[n_0, k_0]$ and $C_1[n_1, k_1]$ be two binary linear codes of length $n_0=n_1=n/2$, with dimension $k_0$ and $k_1$, respectively. It is assumed that $C_0[n_0, k_0]$ has an efficient list decoding algorithm. Then, TPST code is constructed with length n and dimension $k=k_0+k_1$ as follows. Let $u=(u^{(0)}, u^{(1)}) \in F_2^k$ be a pair of information sequences to be transmitted, where $u^{(0)} \in F_2^{k_0}$ and $u^{(1)} \in F_2^{k_1}$ are associated with Layer 0 and Layer 1, respectively. Let $R_v$ be an n×n binary random matrix and $\Pi$: $w=c^{(1)}\Pi$, wherein $\Pi$ is a $n_1 \times n_0$ binary matrix, each column of which has weight of no more than 1, referred to as a selection matrix. An exemplary encoding algorithm of TPST is described in Algorithm 1 below. Figuratively speaking (as depicted in FIG. 3), the two information sequences are first encoded by the basic encoder and then superposed together in a twisted manner.

Algorithm 1: Twisted-Pair Superposition Transmission
Basic Encoding: Encode $u^{(i)}$ into $v^{(i)} \in F_2^n$ by the encoding algorithm of the basic code $C_i[n_i, k_i]$, for i=0, 1.

Forward Superposition: Compute $w^{(0)}=v^{(0)}R_v$ and $c^{(1)}=v^{(1)}+w^{(0)}$.

Backward Superposition: Compute $w^{(1)}=c^{(1)}\Pi$ and $c^{(0)}=v^{(0)}+w^{(1)}$.

The encoding result is a sequence $c=(c^{(0)}, c^{(1)}) \in F_2^n$. Evidently, the TPST code is a block code constructed from the basic code, which has the coding rate $$\frac{k_0+k_1}{n}.$$

Let $G_i$ and $H_i$ be a generator matrix and a parity-check matrix of the basic code $C_i[n_i, k_i]$, for i=0, 1. The generator matrix and the parity-check matrix of a TPST code is given, respectively, by $$G_{TPST} = \begin{pmatrix} G_0 & \\ & G_1 \end{pmatrix} \begin{pmatrix} I & R_v \\ & I \end{pmatrix} \begin{pmatrix} I & \\ \Pi & I \end{pmatrix} \quad (1)$$
$$= \begin{pmatrix} G_0 + G_0 R_v \Pi & G_0 R_v \\ G_1 \Pi & G_1 \end{pmatrix}$$

and $$H_{TPST} = \begin{pmatrix} H_0 & \\ & H_1 \end{pmatrix} \begin{pmatrix} I & \\ R_v^T & I \end{pmatrix} \begin{pmatrix} I & \Pi^T \\ & I \end{pmatrix} \quad (2)$$
$$= \begin{pmatrix} H_0 & H_0 \Pi^T \\ H_1 R_v^T & H_1 + H_1 R_v^T \Pi^T \end{pmatrix}$$

From the construction, it can be seen that the generator matrix of a TPST code is decomposed into three parts: a block diagonal one corresponding to the basic codes, a block upper triangle matrix corresponding to the forward superposition, and a block lower triangle matrix corresponding to the backward superposition. Therefore, similar to the PAC code construction, which is regarded as a form of upper-lower decomposition of the generator matrix, the TPST code construction may be regarded as a block upper-lower decomposition of the generator matrix in an alternative way.

The generator matrix of a TPST code consists of three types of submatrices, the basic code generator matrices $G_0$ and $G_1$, the random transformation $R_v$ and the selection matrix $\Pi$.

The basic code generator matrices, $G_i$: $F_2^{k_i} \to F_2^{n_i}$, transform the information sequences into basic codewords, for i=0, 1. The coding rate of TPST code is tunable by adjusting the information length $k_0$ and $k_1$ of the basic codes.

The random transformation, $R_v$: $F_2^{n_0} \to F_2^{n_1}$, transforms the basic codeword $v^{(0)}$ of Layer 0 into a random sequence, which is superimposed on Layer 1 at Step Forward Superposition. Any error bit in Layer 0 will cause an "avalanche effect" on Layer 1, which is critical to distinguish the correct candidate codeword from the erroneous ones in a list decoding algorithm.

The selection matrix, $\Pi$: $F_2^{n_1} \to F_2^{n_0}$, transforms $c^{(1)}$ into a masked sequence, which is superimposed on Layer 0 at Step Backward Superposition. The fraction of non-zero elements in the diagonal entries of H, denoted by α, is referred to as the superposition fraction, where the case α=1 corresponds to full superposition, and the case α<1 corresponds to a partial superposition.

For decoding, for simplicity, it is assumed that c is modulated using binary phase-shift keying (BPSK) and transmitted over an additive white Gaussian noise (AWGN) channel. The resulting received sequence is denoted by y and the channel transition probability density is denoted by $W(y|x)$ for $y \in R$, $x \in \{0, 1\}$. A notation with a hat sign (^) is used to denote the corresponding estimated messages according to the decoder output.

Given a received sequence $y=(y^{(0)}, y^{(1)})$, the optimal decoding in terms of minimizing FER is the ML decoding, which finds the TPST codeword c such that:

$$P(y|c^*) = \max_{\substack{v^{(0)} \in \mathscr{C}_0 \\ v^{(1)} \in \mathscr{C}_1}} P(y^{(0)}, y^{(1)}|c^{(0)}, c^{(1)}). \quad (3)$$

Let $l_{max}$ be a positive integer. A sub-optimal solution is to apply the successive cancellation list decoding (which indeed is optimal when the list size $l_{max}=2^{k_0}$ and ML decoding is employed at Layer 1) as described below.

(1) From the backward superposition as shown in FIG. 3:

$$v^{(0)} = c^{(0)} + c^{(1)}\Pi. \quad (4)$$

Hence, similar to polar codes, the log-likelihood ratios (LLRs) of $v^{(0)}$ can be computed from $(y^{(0)}, y^{(1)})$, the noisy version of $(c^{(0)}, c^{(1)})$. To be precise, by assuming that $c^{(1)}$ is identically uniformly distributed (i.u.d.), the LLRs of $v^{(0)}$ is (for simplicity, the following assumes $\Pi$ is a diagonal matrix, and $n_0=n_1=n/2$):

$$\Lambda(v_j^{(0)}) = \begin{cases} \log \dfrac{w(y_j^{(0)}|0)}{w(y_j^{(0)}|1)}, & \Pi_j = 0 \\ \log \dfrac{w(y_j^{(0)}|0)w(y_j^{(1)}|0) + w(y_j^{(0)}|1)w(y_j^{(1)}|1)}{w(y_j^{(0)}|1)w(y_j^{(1)}|0) + w(y_j^{(0)}|0)w(y_j^{(1)}|1)}, & \Pi_j = 1 \end{cases}, \quad (5)$$

for $j=0, 1, \ldots n-1$, where the subscript j denotes the j-th component of the sequence. Taking $\Lambda(v^{(0)})$ as input to the basic list decoder of $C_0$, a list of candidate codewords $\hat{v}_l^{(0)}$; $l=1, 2, \ldots, l_{max}$ is obtained.

(2) From the encoding process of TPST:

$$\begin{cases} v^1 = c^{(1)} + v^{(0)}R_v \\ v^{(1)}\Pi = c^{(0)} + v^{(0)} + v^{(0)}R_v\Pi \end{cases} \quad (6)$$

indicating that $v^{(1)}$ is transmitted twice (with partial masking if partial superposition is employed). Hence, if $v^{(0)}$ is obtained by the decoder, the LLRs of $v^{(1)}$ can be computed as, $$\Lambda(v_j^{(1)}) = \log \dfrac{w(y_j^{(1)}|w_j^{(0)})}{w(y_j^{(1)}|w_j^{(0)}+1)} + \Pi_j \log \dfrac{w(y_j^{(0)}|w_j^{(0)}+v_j^{(0)})}{w(y_j^{(0)}|w_j^{(0)}+v_j^{(0)}+1)}, \quad (7)$$

for $j=0, 1, \ldots n-1$. However, since $v^{(0)}$ is unknown at the receiver, $\Lambda_l(v^{(1)})$ is calculated instead by treating each candidate codeword $\hat{v}_l^{(0)}$ as correct. Then, $\hat{v}_l^{(1)}$ is estimated by taking $\Lambda_l(v^{(1)})$ as input to the basic decoder of $C_1$.

The LLRs $\Lambda_l(v^{(1)})$, calculated by (7), match with the channel if and only if the candidate $\hat{v}_l^{(0)}$ is correct. In the case when $\hat{v}_l^{(0)}$ is erroneous, the mismatch can be roughly measured by the weight of binary interference $\Delta v(I+R_v\Pi,$ $R_v)$, where $\Delta v = \hat{v}_l^{(0)} + v^{(0)} \neq 0$. Since $R_v$ is randomly generated, a nonzero $\Delta v$ may cause a significant change on the joint typicality between $(c_l^{(0)}, c_l^{(1)})$ and $(y^{(0)}, y^{(1)})$.

For each candidate pair $\hat{v}_l = (\hat{v}_l^{(0)}, \hat{v}_l^{(0)})$, the decoder computes the likelihood of the corresponding TPST codeword $P(y|\hat{c}_l)$ and selects the most likely one as the decoding output.

An exemplary decoding procedure is summarized in Algorithm 2.

Algorithm 2: Successive Cancellation List Decoding of TPST

Initialization: Take the received sequence y as input and compute the likelihood of $v^{(0)}$ given by (5).

List Decoding: Employ the list decoding algorithm of the basic code for Layer 0, resulting in $l_{max}$ candidate subcodewords $\{\hat{v}_l^{(0)}\}$.

For $1 \leq l \leq l_{max}$,
1) By viewing $\hat{v}_l^{(0)}$ as correct, compute the LLRs of $v^{(1)}$ given by (7).
2) Employ the decoding algorithm of the basic code for Layer 1, resulting in the decoding output $\hat{v}_l^{(1)}$.
3) Compute the likelihood of the TPST codeword $P(y|\hat{c}_l)$.

Output: Output the TPST codeword $\hat{c}$ such that $$P(y|\hat{c}) = \max_{1 \leq t \leq l_{max}} P(y|\hat{c}_t).$$

Performances of the proposed embodiments are analysed. Firstly, performance bounds are analysed. For analysing the performance of the proposed SCL decoding algorithm for TPST codes, the following events are considered:

The event $E_0$ that the transmitted basic codeword $v^{(0)}$ s of Layer 0 is not in the list, i.e., $\hat{v}_l^{(0)} \neq v^{(0)}$ for $l=1, 2, \ldots, l_{max}$;

The event $E_1$ that given the transmitted basic codeword $v^{(0)}$ of Layer 0, the basic decoder does not output the transmitted basic codeword $v^{(1)}$ of Layer 1, i.e., $\hat{v}_l^{(1)} \neq v^{(1)}$ if $\hat{v}_l^{(0)} = v^{(0)}$;

The event $E_2$ that there exists a valid codeword in the decoding list which is more likely than the transmitted codeword, i.e., $P(y|\hat{c}_l) > P(y|c)$ for some $l \in \{1, 2, \ldots, l_{max}\}$.

Hence, the FER performance of the TPST code with the proposed SCL decoding may be expressed as $$\text{FER}_{SCL} = P(E_0 \cup E_1 \cup E_2). \quad (8)$$

The following are lower bounds:

(1) Genie-Aided Bound $P(E_0)$ for Layer 0

The received vector $y^{(0)}$ can be viewed as a noisy version of $v^{(0)}$, where $c^{(1)}$ is considered as binary interference with side information $y^{(1)}$. The link $v^{(0)} \rightarrow y^{(0)}$ is referred to as the binary interference AWGN channel. From (8), $P(E_0)$ is a lower bound of $\text{FER}_{SCL}$. To estimate $P(E_0)$, a genie-aided list decoder in which the decoder outputs the transmitted codeword is considered if it is in the list (told by a genie). Hence, the genie-aided bound $P(E_0)$ may be obtained by simulations on the list decoding performance of the basic code for Layer 0 over the binary interference AWGN channel.

(2) Genie-Aided Bound $P(E_1)$ for Layer 1

By removing the effect of $v^{(0)}$, both the received vector $y^{(0)}$ (or only parts of $y^{(0)}$ when partial superposition is employed) and $y^{(1)}$ may be equivalently viewed as noisy versions of $v^{(1)}$ transmitting over the AWGN channel. The link $v^{(1)} \rightarrow \{(y^{(0)}, y^{(1)}|v^{(0)})\}$ is referred to as the repetition AWGN channel. Obviously, $P(E_1)$ is also a lower bound of $\text{FER}_{SCL}$. To estimate $(E_1)$, a genie-aided decoder for decoding $v_I^{(1)}$ in which the decoder is told by a genie that the correct information bits $v_I^{(0)}$ is considered. Hence, $P(E_1)$ may be obtained by simulations on the performance of the basic code for Layer 1 over the repetition AWGN channel.

It may be noticed that both $P(E_0)$ and $P(E_1)$ are irrelevant to the random transformation R. This makes it more convenient to analyze the performance by the lower bound given by $$\text{FER}_{SCL} \geq \max\{P(E_0), P(E_1)\}, \quad (9)$$

which is denoted as the genie-aided (GA) bound for the TPST construction in the sequel.

Figure 5:
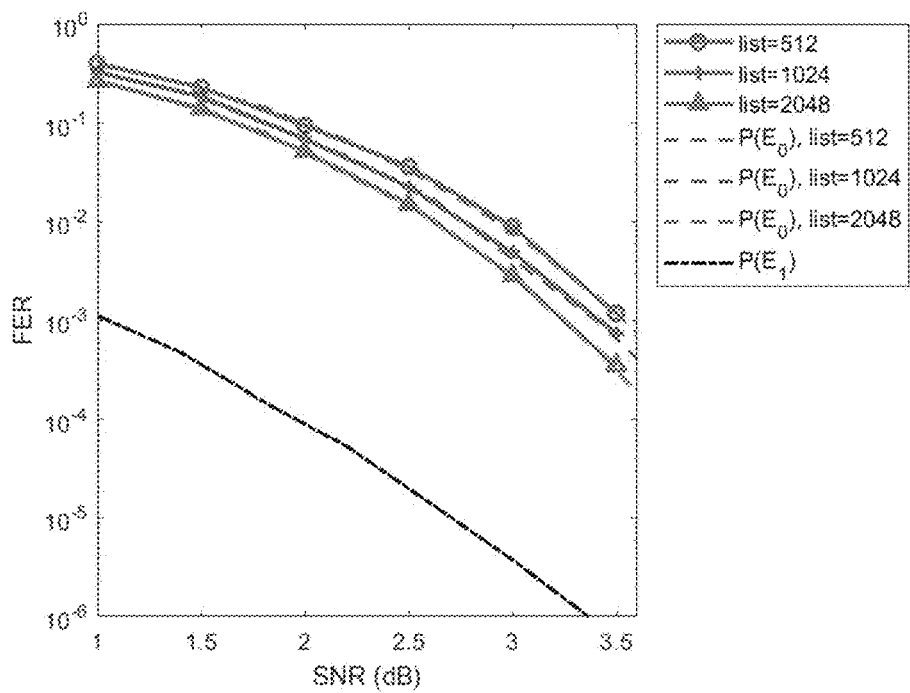
FIG. 5 shows genie-aided bounds of TPST-TBCCs with different list sizes. The dashed curves are genie-aided bounds for Layer 0, the dash-dotted curve is the genie-aided bound for Layer 1, and the solid curves are the simulation performance.

As an example: the TBCCs are taken as basic codes, resulting in the TPST-TBCCs. The basic code for Layer 0 is decoded by serial list Viterbi algorithm (SLVA), and the basic code for Layer 1 is decoded by Viterbi algorithm (VA). First, the (2, 1, 4) TBCC defined by the polynomial generator matrix $G(D)=(1+D^2+D^3+D^4, 1+D+D^4)$ (also denoted in octal notation as $(56, 62)_8$) with information length 32 is taken as the basic codes for both the two layers. The random matrix $R_v$ is sampled from the permutation matrices and let Π be the identity matrix for simplicity. As a result, the constructed TPST-TBCC is a rate-1/2 block code with length 128. The genie-aided bounds are shown in FIG. 5, where the simulated error rates of Layer 0 are also plotted. One may observe that:

- The genie-aided performance of $v^{(0)}$ may be improved by increasing the list size $l_{max}$, as expected.
- The curves of simulated error rate of $v^{(0)}$ match very well with the genie-aided bounds, suggesting that the decoder can well distinguish the correct codeword (once it is in the decoding list) from erroneous ones. Hence one may use the genie-aided bound (9) as guidance for selecting the coding parameters of TPST codes.
- In this example, the use of random interleaver instead of random transformation in the forward superposition step only causes a negligible loss in performance. Evidently, this reduces much the encoding/decoding complexity for practical implementations.
- When taking the same basic code for the two layers and employing full superposition, there exists a large gap between the genie-aided performance of $v^{(0)}$ and $v^{(1)}$. As a result, the decoding of $v_I^{(0)}$ dominates FER performance of the TPST code.

(3) Lower Bound $P(E_2)$ for ML Decoding

Let $\text{FER}_{ML}$ be the FER performance of the TPST code with ML decoding. Since the ML decoding outputs the most likely codeword, an error occurs if and only if the transmitted codeword c is not with the highest likelihood among the codebook C. Therefore, once the given decoder outputs a valid codeword that is more likely than the transmitted one, the ML decoding will surely make an error in this instance as well. Hence, $P(E_2)$ is not only a lower bound of $\text{FER}_{SCL}$, but also a lower bound of $\text{FER}_{ML}$. $P(E_2)$ may be estimate by simulating the frequency of the event that the decoding output has a higher likelihood than the transmitted one. Then the performance of ML decoding is bounded by $$P(E_2) \leq \text{FER}_{ML} \leq \text{FER}_{SCL}. \quad (10)$$

Now, the proposed SCL decoding attains a near-ML performance as follows. By applying the union bound technique, an upper bound of $\text{FER}_{SCL}$ from (8) is obtained as $$\text{FER}_{SCL} \leq P(E_0) + P(E_1) + P(E_2). \quad (11)$$

Therefore, the gap between the SCL performance and the ML performance may be upper bounded by $$\text{FER}_{SCL} - \text{FER}_{ML} \leq \text{FER}_{SCL} - P(E_2) \leq P(E_0) + P(E_1). \quad (12)$$

Hence, by lowering down the genie-aided bounds for the two layers, one may construct a TPST code with an SCL decoding algorithm attaining a near-ML performance.

More specifically, if the basic decoder for Layer 1 is ML decoding (e.g., taking TBCC with Viterbi decoding algorithm as basic code), the upper bound of the gap may be further tightened. In this case, the instance that $v^{(0)}$ of Layer 0 is in the list and the basic decoder of Layer 1 outputs a basic codeword $\hat{v}^{(1)}$ of Layer 1 other than $v^{(1)}$ of Layer 1 implies that the SCL decoder finds a valid TPST codeword more likely than the transmitted one. Hence, one has $E1 \subseteq E2$ and $$\text{FER}_{SCL} = P(E_0 \cup E_2) \leq P(E_0) + P(E_2). \quad (13)$$

Then the gap between the SCL performance and the ML performance is upper bounded by $$\text{FER}_{SCL} - \text{FER}_{ML} \leq \text{FER}_{SCL} - P(E_2) \leq P(E_0). \quad (14)$$

the genie-aided bound for Layer 0.

Besides, performance bounds, complexity analysis and early termination may be performed. From Algorithm 2, the complexity of the proposed SCL decoding mainly consists of two parts: list decoding for Layer 0 and decoding for Layer 1 for each candidate sub-codeword.

S-state TBCCs is taken as basic codes, which are decoded by SLVA with list size L for Layer 0 and by VA for Layer 1. For simplicity, the add-compare-select operation is taken as an atomic operation to measure the complexity. For Layer 0, by going through all the s states as initial states, $s^2 k_0$ operations are need to find the best candidate, while only $k_0$ operations are needed for each other L−1 candidates, i.e., the SLVA requires $s^2 k_0 + (L-1) k_0$ operations. For Layer 1, VA is employed for each candidate, which needs $Ls^2 k_1$ operations. Hence, the total number of operations for the proposed SCL decoding is given by $$\#\text{Opt} = (s^2 + L - 1) k_0 + Ls^2 k_1. \quad (15)$$

It can be seen that the decoding complexity is dominated by the term $Ls^2 k_1$. One way to lower down the complexity is to employ WAVA for decoding the basic code of Layer 1, where with I=4 the decoder performs near optimally. In the test discussed in a later section, the constructed TPST-TBCC with 16 states performs similar to TBCC with 256 states.

To attain a near-ML performance, the decoding requires a large list size $l_{max}$, which incurs a high decoding complexity. However, the average list size for $v^{(0)}$ to be included in the decoding list is typically small, especially in the high SNR region. Hence, to reduce the complexity, the serial list decoding of Layer 0 is considered, and a criterion for identifying the correct codeword is designed, so that the list decoding can be early terminated.

The metric of empirical divergence function (EDF) for the early termination is given as $$D(y, v) = \frac{1}{2n} \log_2 \frac{P(y|c)}{P(y)}, \quad (16)$$

where P(y) is obtained by assuming a uniformly distributed input. The correct candidate v will typically result in $D(y, v) \approx I(V; Y) > 0$. Conversely, an erroneous candidate may cause a significant change on the joint typicality between $(\hat{c}_I^{(0)}, \hat{c}_I^{(0)})$ and $(y^{(0)}, y^{(1)})$. Hence, the EDF associated with an erroneous candidate is typically less than that of the correct one. An off-line learned threshold T is set for early termination, where the decoding candidate $\hat{v}_l=(\hat{v}_l^{(0)}, \hat{v}_l^{(1)})$ is treated as correct if $(y, \hat{v}_l)>T$. The SCL decoding with early termination is described in Algorithm 3 below.

Algorithm 3: Successive Cancellation List Decoding of TPST with Early Termination Initialization: Set l=0 and =−∞. Take the received sequence y as input and compute the likelihood of $v^{(0)}$ given by (5).

List Decoding: While $l<l_{max}$ and D<T,
1) Employ the serial list decoding algorithm of the basic code for Layer 0, resulting in the l-th list decoding output $\hat{v}_l^{(0)}$.
2) By viewing $\hat{v}_l^{(0)}$ as correct, compute the LLRs of $v^{(1)}$ given by (7).
3) Employ the decoding algorithm of the basic code for Layer 1, resulting in the decoding output $\hat{v}_l^{(1)}$.
4) Compute the EDF $D(y, \hat{v}_l)$. If $D(y, \hat{v}_l)>D$, update the metric D as $D(y, \hat{v}_l)$ and the estimated TPST codeword $\hat{c}$ as $\hat{c}_l$.
5) Update the list size l as l+1.

Output: Output the estimated TPST codeword $\hat{c}_l$.

Design for finite-length regime is now explained. As discussed above, the performance of a TPST code is lower bounded by $\max\{P(E_0), P(E_1)\}$, and the gap to the ML decoding is upper bounded by $P(E_0)+P(E_1)$. However, Example 1 shows that there exists a gap between the genie-aided bounds of the two layers, $(E_0)\gg P(E_1)$, resulting in poor performance. To improve the performance, two approaches are considered to narrowing the gap. One is to reduce the coding rate of Layer 0 by changing the basic codes with different rates, and the other is to improve the channel for Layer 0 by introducing partial superposition during backward superposition to reduce the binary interference from Layer 1.

The first approach is rate allocation. From the derivation of the genie-aided lower bounds, when full superposition is employed, the genie-aided bounds may be obtained by simulations on the basic codes transmitted over binary interference AWGN channels and the repetition AWGN channels. With the help of genie-aided bounds, the basic codes with different rates may be chosen to construct TPST codes with good performance within an SNR region of interest.

Suppose that there is a family of basic codes of length n with different rates with their genie-aided bounds available. For example, the basic codes with different rates can be constructed by puncturing from a mother code and the genie-aided bounds can be obtained by off-line simulations over the binary interference AWGN channel and the repetition AWGN channel. Then the procedure of designing TPST code with length 2n and dimension k by the rate allocation approach is described as follows.

1) Estimate the decoding performance in the given SNR region. For example, at the SNR near 3.5 dB, one expects, from the existed codes and the RCU bound, the constructed code with length 128 to have an error rate at the level of $10^{-5}$.
2) According to the error performance over the repetition AWGN channel, determine $k_1$ such that a basic code with dimension $k_1$ has an error performance near the estimated error rate, which is taken as $C_1[n_1, k_1]$, the basic code for Layer 1.
3) Let $k_0=k-k_1$. Take the basic code with dimension $k_0$ as $C_0[n_0, k_0]$, the basic code of Layer 0.
4) Increase the decoding list size $l_{max}$ of $C_0[n_0, k_0]$ such that the list decoding performance of $C_0[n_0, k_0]$ over the binary interference AWGN channel achieves an error rate near the estimated one.

Figure 6:
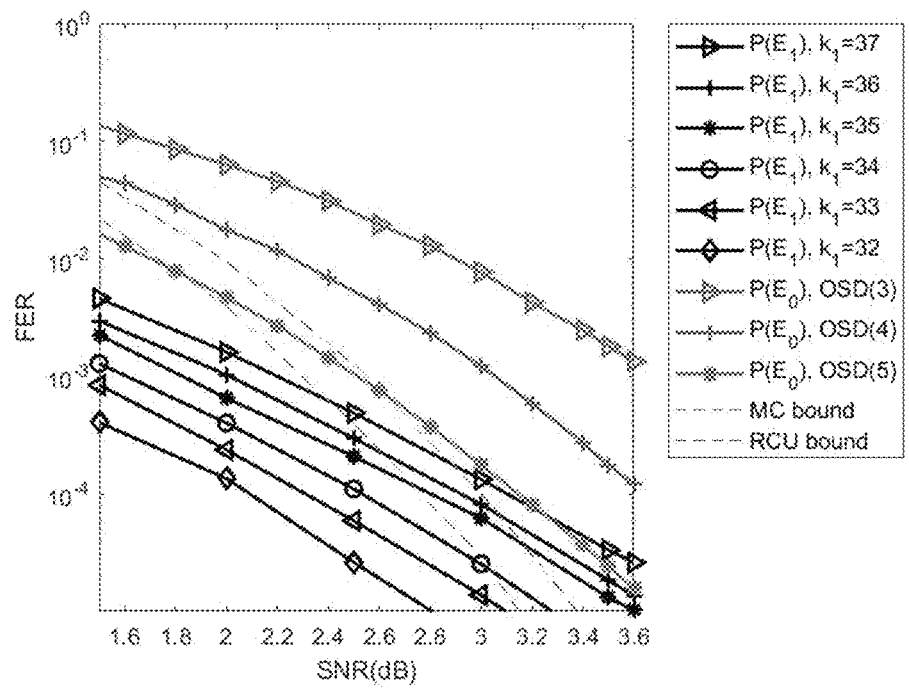
FIG. 6 shows genie-aided bounds of the basic codes. For Layer 1, the basic codes are (punctured) (2, 1, 4) TBCCs defined by the polynomial generator matrix $G(D)=(56, 62)_8$ with length 64 and dimension from 32 to 37. For Layer 0, the basic code is the random code with length 64 and dimension 29.

As another example: random codes with ordered-statistic list decoding is considered as basic codes for Layer 0 and (punctured) TBCCs with Viterbi decoding as basic codes for Layer 1. To construct good TPST codes with length 128 and dimension 64 in the SNR region near 3.5 dB, the (punctured) $(2, 1, 4)$ TBCC defined by the polynomial generator matrix $G(D)=(56, 62)_8$ is used to construct the basic codes with different rates. The genie-aided bounds of the basic codes are shown in FIG. 6. It may be observed that:

As the increase of the dimension $k_1$ of the TBCCs the performance of genie-aided bounds for Layer 1 decreases. From the RCU bound, one expects to construct TPST code with FER at the level of $10^{-5}$ at the SNR near 3.5 dB. Hence the code with dimension $k_1=35$ is chosen as the basic code for Layer 1.

Then random code with length 64 and dimension $k_0=29$ with OSD is taken as the basic code for Layer 0. To attain the estimated FER performance, the OSD algorithm with order 5 is considered for the decoding of Layer 0. However, it suffers from an extremely high decoding complexity (where the list size is 146596 for OSD with order 5) and hence is impractical for implementation.

Figure 7:
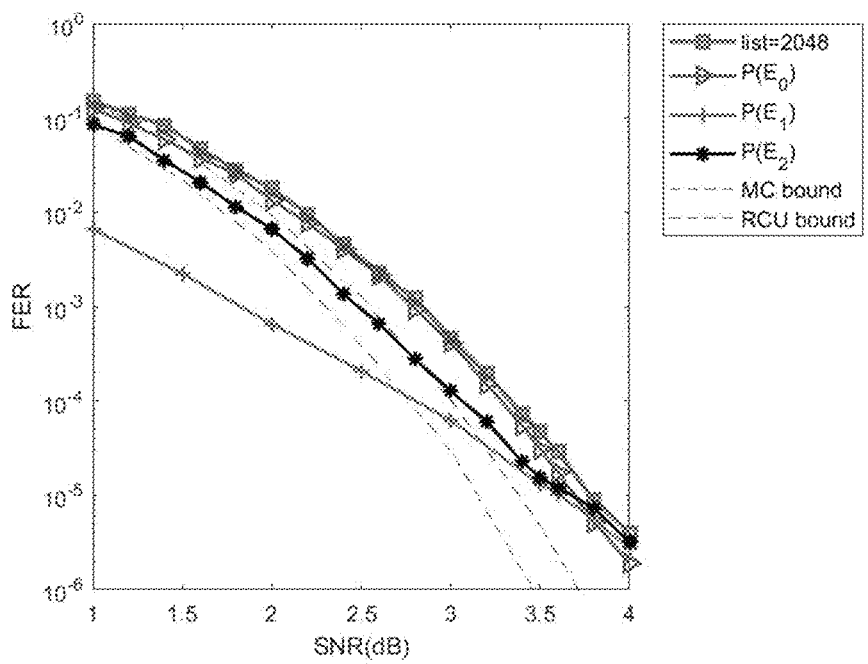
FIG. 7 shows decoding performance of the TPST-TBCC designed by the rate allocation approach.

Alternatively, TBCC with list Viterbi algorithm is considered as the basic code for Layer 0. A $(3, 1, 4)$ TBCC defined by the polynomial generator matrix $G(D)=(52, 66, 76)_8$ is punctured to fit the length 64 and dimension 29, where the performance is shown in FIG. 7. It may be observed that:

By setting a maximum list size $l_{max}=2048$, the genie-aided bound for Layer 0 has a similar performance to that of Layer 1 at the SNR near 3.5 dB.

At the SNR of 3.5 dB, the SCL decoding performance of the constructed TPST code is within 0.25 dB away from the lower bound of ML decoding performance, showing that the proposed SCL decoding is near ML. Also, since the ML performance is sandwiched between the RCU bound and the SCL performance, it can be seen that the constructed TPST code has an ML performance near the RCU bound.

It can be seen from the above examples that the list Viterbi decoding of TBCC is more efficient than the OSD decoding in the sense of list size. Hence, TBCC is considered as basic codes for the TPST code construction in the sequel.

The second approach is by partial superposition. Different from the rate allocation approach that adjusts the coding rate of the two layers of TPST codes, the following partial superposition approach adjusts the channels for the two layers. The so-called superposition fraction $\alpha$ is introduced to characterize the partial superposition. Given $\alpha$, one may construct the binary diagonal matrix $\Pi$ by assigning $\lfloor n_1\alpha \rfloor$ ones and $n_1-\lfloor n_1\alpha \rfloor$ zeros homogeneously (as uniformly as possible) to the $n_1$ positions. For simplicity of designing, the same basic code may be employed on both layers.

Recall that the link $v^{(0)}\to y^{(0)}$ can be viewed as the binary interference AWGN channel, where $c^{(1)}$ is considered as binary interference with side information $y^{(1)}$. Therefore, $P(E_0)$ can be lowered down by reducing the binary interference, which can be achieved by decreasing the superposition fraction $\alpha$.

Recall that with $v^{(0)}$ available, the link $v^{(1)}\to \{(y^{(0)}, y^{(1)} |v^{(0)}\}$ can be viewed as the repetition AWGN channel, where $v^{(1)}$ is transmitted twice over AWGN channels (one is with partial masking). Therefore, decreasing the superposition fraction α leads to performance degradation of the genie-aided decoder for $v^{(1)}$ and hence increases ($E_1$).

In summary, compared with full superposition, decreasing the superposition fraction a can narrow the gap between the two genie-aided bounds, as illustrated in the following example.

Figure 8:
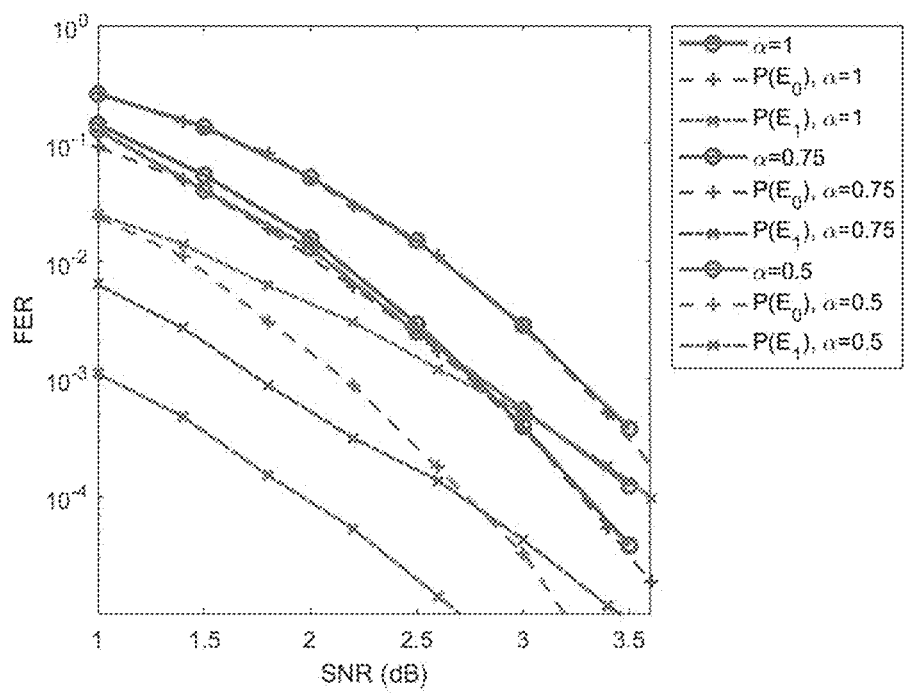
FIG. 8 shows decoding performance of the TPST-TBCCs with different superposition fractions. The dashed curves are genie-aided bounds for Layer 0, the dash-dotted curves are genie-aided bounds for Layer 1, and the solid curves are the simulation performance.

In this example, the same basic code as in paragraph 72 is taken and the TPST code is constructed with different superposition fractions α=0.5, 0.75 and 1.0. The genie-aided bounds for $l_{max}$=2048 are shown in FIG. 8. It can be observed that a smaller superposition fractions results in a lower genie-aided bound for decoding Layer 0 and a higher genie-aided bound for decoding Layer 1. Hence, TPST codes are constructed by optimizing the superposition fraction a such that the genie-aided bounds of the two layers have a similar performance in the SNR region of interest.

The following presents numerical simulations based on embodiments of the present disclosure. The flexibility of the construction lies in the following facts. 1) Any block codes with a fast encoding and efficient list decoding can be adopted as basic codes. 2) Given a family of basic codes with different rates, it is easy to construct good TPST codes within an SNR region of interest by the rate allocation approach. 3) For the basic codes with a given coding rate, the construction can be easily improved by optimizing the superposition fraction. In this subsection, TPST-TBCCs is taken as examples and it is shown by numerical simulations that the constructed TPST-TBCCs, with a wide range of coding rates, have good performance in the finite length regime.

Figure 9:
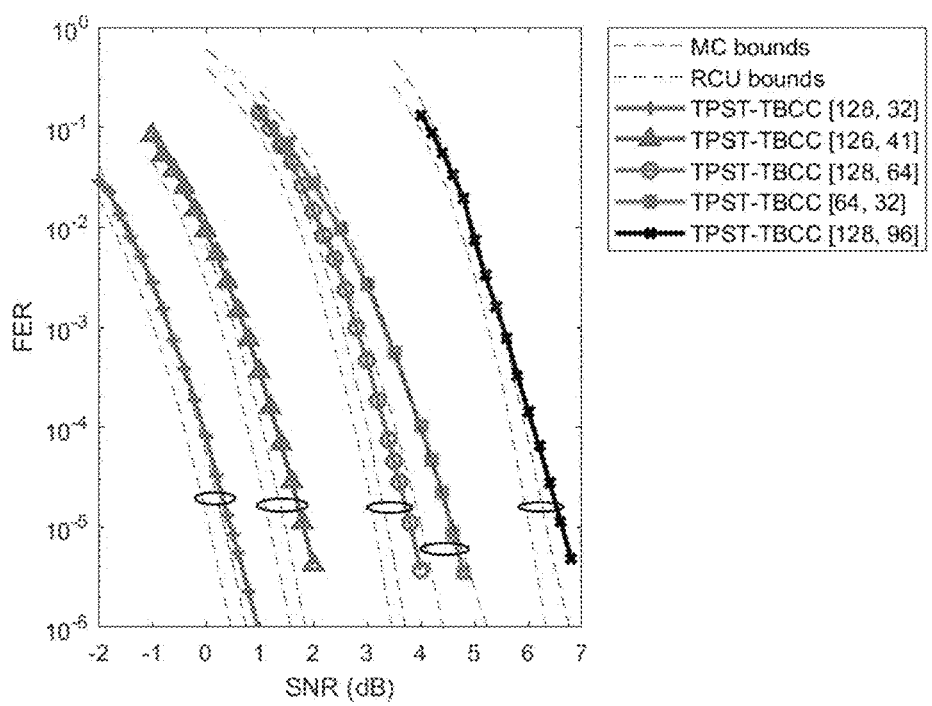
FIG. 9 shows decoding performance of the TPST-TBCCs with different basic codes.
Figure 10:
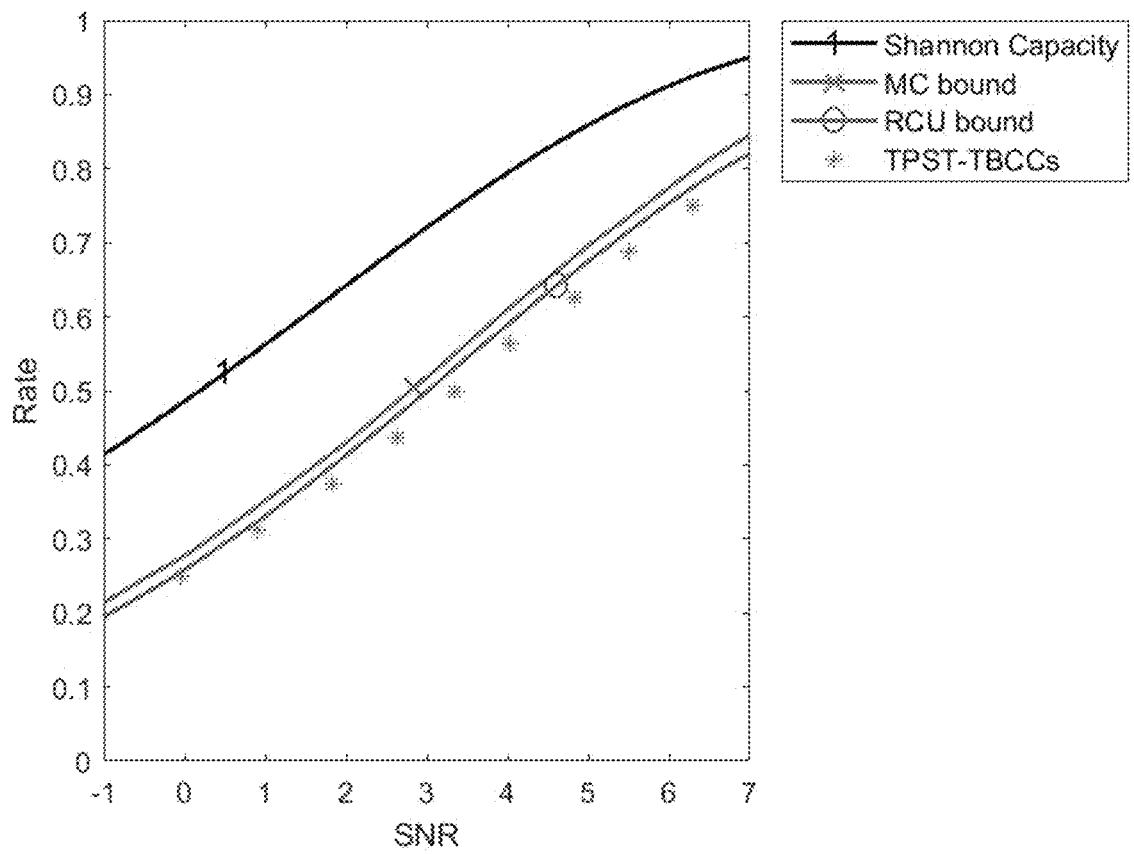
FIG. 10 shows performance of TPST-TBCCs with length 128 at the FER of $10^{-4}$.

Examples are provided below to show construction with different basic codes. TPST-TBCCs are constructed with different basic codes. TBCCs with different coding lengths and rates are used as the mother codes for the basic codes, where their generators (in octal notation) are listed in Table I. For example, to construct a basic codeword with coding length 64 and rate 3/4, every third bit of the TBCC C[96, 48] encoder output is punctured. The TPST codes are encoded with superposition fraction α=0.75 and decoded with list size $l_{max}$=2048. The simulation results are shown in FIG. 9. For comparison, the coding bounds is also plotted on the minimum FER in the finite length regime, which show that the proposed TSPT-TBCCs have good performance close to the RCU bounds with different rates and lengths. Focusing on the performance with length 128 at the FER of $10^{-4}$, the comparison between the performance of TPST-TBCCs and the bounds of achievable rates are shown in FIG. 10. It can be seen that the proposed TPST scheme may be used to construct codes with different rates close to the analytical bounds in the finite length regime.

TABLE I

BASIC TBCCS USED

| Rate | Memory | Generators |
|---|---|---|
| 1/4 | 4 | $(52; 56; 66; 76)_8$ |
| 1/3 | 4 | $(52; 66; 76)_8$ |
| 1/2 | 4 | $(56; 62)_8$ |

Figure 11:
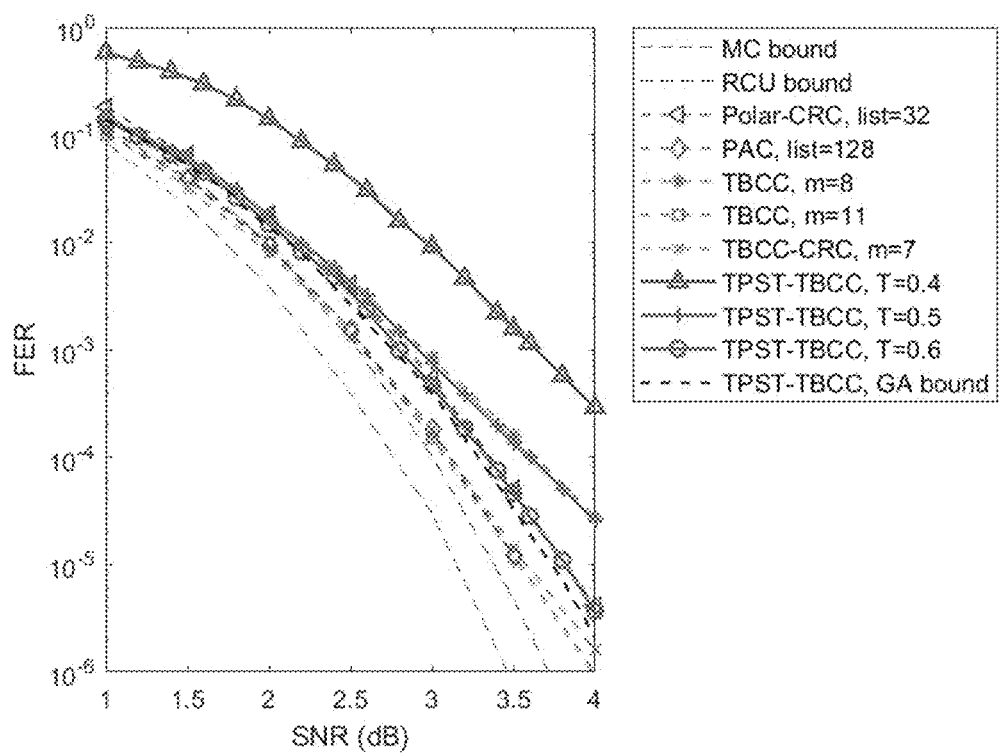
FIG. 11 shows decoding performance of the TPST-TBCCs with different thresholds.

To investigate trade-off between complexity and performance, the same basic code as in paragraph 72 is taken. The TPST code is encoded with superposition fraction α=0.75 and decoded with the maximum list size $l_{max}$=2048, where different thresholds are used for early termination. The simulation results are shown in FIG. 11, and their corresponding decoding complexity in terms of average list size are given in Table II. For comparison, the performance curves of known PAC code, polar-CRC code and TBCCs, and TBCC-CRC with length n=128 and dimension k=64 is also drawn. It can be observed that:

The complexity (average list size), at the cost of performance loss, may be reduced by tuning down the threshold T.

The proposed TPST-TBCC with list decoding has a competitive performance with the TBCCs with large memory. However, in our TPST construction, the basic TBCCs are with memory m=4 which have a much smaller number of states in their trellises. As a result, it has a lower decoding complexity than that of the TBCCs with large memory. For instance, at the SNR of 3.5 dB, the average number of operations of the presented TPST-TBCC with threshold T=0.5 is about $1.3 \times 10^4$. It is less than that of TBCC with m=8, which is about $6.6 \times 10^4$.

By selecting properly a threshold, the decoding of TPST code has performance near the RCU bound with a relatively low decoding complexity. For example, at the SNR of 3.5 dB, the FER performance of the presented TPST-TBCC with threshold T=0.5 is about 0.6 dB away from the RCU bound. Whereas, the average list size for the SCL decoding is only around two, which is much less than the maximum list size 2048.

TABLE II

AVERAGE LIST SIZE NEEDED FOR DIFFERENT THRESHOLD T

| SNR | 1.0 | 1.4 | 1.8 | 2.2 | 2.6 | 3.0 | 3.4 | 3.5 | 3.6 | 3.8 |
|---|---|---|---|---|---|---|---|---|---|---|
| T = 0.4 | 12.1 | 18.1 | 18.8 | 13.1 | 9.11 | 3.79 | 1.85 | 1.55 | 1.38 | 1.19 |
| T = 0.5 | 459 | 275 | 132 | 55.3 | 22.9 | 7.48 | 2.70 | 2.25 | 1.88 | 1.44 |
| T = 0.6 | 1412 | 1042 | 685 | 396 | 199 | 86.6 | 33.4 | 25.9 | 20.1 | 12.0 |

A novel coding scheme referred to as twisted-pair superposition transmission is disclosed herewith, which is constructed by mixing up basic codes by superposition. Based on the list decoding of the basic codes, an SCL decoding algorithm is presented for the TPST codes. To reduce the complexity, thresholds may be presented for early termination of the decoding, which can significantly reduce the decoding complexity at the expense of a slight decoding performance degradation. Bounds for the FER performance is derived, which shows that the performance of the proposed SCL decoding is near-ML and can be easily predicted by the genie-aided bounds obtained from the basic codes. Based on the genie-aided bounds, two design approaches is presented for the construction of TPST codes. Taking TBCCs as basic codes, it is shown by numerical simulations that the constructed TPST-TBCCs have performance close to the RCU bound in a wide range of coding rates in the short length regime.

The novel coding scheme may be implemented in an apparatus or a device. The implementation principles and technical effects of the device provided in the embodiments of the application are the same as those of the foregoing method embodiments.

An embodiment of the present application provides an electronic apparatus or device. The electronic device comprises: a processor, a memory, and a communication interface. The processor, the communication interface, and the memory are connected; the processor is configured to execute an executable module stored in the memory, such as a computer program. The processor implements the steps of the method described in the method embodiments when the processor executes the computer program.

The memory may include a high-speed random access memory (RAM), and may also include a non-volatile memory, such as at least one disk memory. The channel communication connection between the encoder and decoder is realized through a communication means (which may be wired or wireless), the Internet, a wide area network, a local network, a metropolitan area network etc.

Wherein the memory is configured to store a program, and the processor executes the program after receiving an execution instruction. The method executed by the flow process defined apparatus disclosed in any of the foregoing embodiments of the present application can be applied to the processor or realized by the processor.

The processor may be an integrated circuit chip with signal processing capabilities. In the implementation process, the steps of the foregoing method may be completed by an integrated logic circuit of hardware in the processor or instructions in the form of software. The aforementioned processor may be a general-purpose processor, including a central processing unit (CPU for short), a network processor (NP), etc.; it may also be a digital signal processor (DSP for short), Application Specific Integrated Circuit (ASIC for short), Field-Programmable Gate Array (FPGA) or other programmable logic devices, discrete gates or transistor logic devices, and discrete hardware components. The methods, steps, and logical block diagrams disclosed in the embodiments of the present application can be implemented or executed. The general-purpose processor may be a microprocessor or the processor may also be any conventional processor, etc. The steps of the method disclosed in the embodiments of the present application may be directly embodied as being executed by a hardware decoding processor or by a combination of hardware and software modules in the decoding processor. The software module may be located in random access memory, flash memory, read-only memory, programmable read-only memory, electrically erasable programmable memory, or registers and other mature storage media in the field. The storage medium is located in the memory, and the processor reads the information in the memory, and completes the steps of the above method in combination with its hardware.

In another embodiment, there is also provided a computer-readable medium having non-volatile program code executable by a processor, and the program code causes the processor to execute the steps of the method described above.

In the several embodiments provided in this application, it should be understood that the disclosed device and methods may be implemented in other ways. The device embodiments described above are merely illustrative. For example, the division of units is only a logical function division, and there may be other divisions in actual implementation. For further example, multiple units or components can be combined or integrated into another system, or some features can be ignored, or not implemented. In addition, the displayed or discussed mutual coupling or direct coupling or communication connection may be indirect coupling or communication connection through some communication interfaces, devices or units, and may be in electrical, mechanical or other forms.

The units described as separate components may or may not be physically separate, and the components displayed as units may or may not be physical units, that is, they may be located in one place or distributed on multiple network units. Some or all of the units may be selected according to actual needs to achieve the objectives of the solutions of the embodiments.

In addition, the functional units in the various embodiments of the present application may be integrated into one processing unit, or each unit may exist alone physically, or two or more units may be integrated into one unit.

If the function is implemented in the form of a software functional unit and sold or used as an independent product, it can be stored in a non-volatile computer readable storage medium executable by a processor. Based on this understanding, the technical solution of the present application essentially or the part that contributes to the existing technology or the part of the technical solution can be embodied in the form of a software product, and the computer software product is stored in a storage medium, including several instructions to make a computer device (which can be a personal computer, a server, or a network device, etc.) execute all or part of the steps of the methods described in the various embodiments of the present application. The aforementioned storage media include: U disk, mobile hard disk, read-only memory (ROM), random access memory (RAM), magnetic disks or optical disks and other media that can store program codes.

Finally, it should be noted that the above-mentioned embodiments are only specific implementations of this application, which are used to illustrate the technical solution of this application, rather than limiting it. The scope of protection of the application is not limited to this, although the application has been described in detail with reference to the foregoing embodiments, and those of ordinary skill in the art should understand that any person skilled in the art familiar with the technical field within the technical scope disclosed in this application may still modify the technical solutions described in the foregoing embodiments or may easily think of changes or equivalently replace some of the technical features. However, these modifications, changes or replacements do not cause the essence of the corresponding technical solutions to deviate from the spirit and scope of the technical solutions of the embodiments of the present application, and should be covered within the protection scope of the present application. Therefore, the protection scope of this application should be subject to the protection scope of the claims.

We claim:

1. A method for channel communication using a block code with a code length of n and an information bit length of k, the method comprising using at least one hardware processor for:

using component codes $C_0[n_0, k_0]$ and $C_1[n_1, k_1]$ to indicate two block codes with code lengths $n_0$ and $n_1$ respectively, and information bit lengths $k_0$ and $k_1$ respectively such that $n_0+n_1=n$, $k_0+k_1=k$; and encoding, via an encoder, an information sequence $u=(u^{(0)}, u^{(1)})$ of length k into a codeword sequence c of length n, wherein $u^{(0)}$ and $u^{(1)}$ are sub-sequences of u of length $k_0$ and $k_1$ respectively, and correspond to an upper layer and a lower layer of encoding respectively; said encoding comprising:

using the component code $C_0[n_0, k_0]$ to encode the upper layer $u^{(0)}$ into an upper layer component codeword $v^{(0)}$ of length $n_0$, and using the component code $C_1[n_1, k_1]$ to encode the lower layer $u^{(1)}$ into a lower component codeword $v^{(1)}$ of length $n_1$;

coupling the upper layer $u^{(0)}$ into the lower layer component codeword $v^{(1)}$ by superposition to obtain a sequence $c^{(1)}$ of length $n_1$:

$$c^{(1)}=S(u^{(0)})+v^{(1)}$$

wherein S is a coupling function;

obtaining a sequence w with a length of $n_0$ by passing said sequence $c^{(1)}$ through a partial sampler $\Pi$:

$$w=c^{(1)}\Pi$$

wherein $\Pi$ is a $n_1 \times n_0$ binary matrix, in which each column has weight of no more than 1;

superimposing by XOR to obtain a sequence $c^{(0)}$ of length $n_0$:

$$c^{(0)}=v^{(0)}+w; \text{ and}$$

outputting a codeword sequence $c=(c^{(0)}, c^{(1)})$ of length n, by transmitting said codeword sequence through a channel to a decoder.

2. The method according to claim 1, wherein said coupling function S is selected such that a small change in $u^{(0)}$ causes a significant change in $c^{(1)}$.

3. The method according to claim 2, wherein said coupling function S is a random binary matrix $R_u$ of size $k_0 \times n_1$, such that $c^{(1)}=u^{(0)}R_u+v^{(1)}$.

4. The method according to claim 2, wherein said coupling function S is a random binary matrix $R_v$ of size $n_0 \times n_1$, such that $c^{(1)}=v^{(0)}R_v+v^{(1)}$.

5. The method according to claim 2, wherein said coupling function S comprises:

using a polar code as a component code for the lower layer, and use a binary matrix P with a size of $k_0 \times (n_1-k_1)$ and each column of which has weight of no more than 1, to obtain a sequence of length $n_1-k_1$:

$$f=u^{(0)}P,$$

so that $c^{(1)}$ is a polar codeword with f as frozen bits of the lower layer and $u^{(1)}$ as information bits.

6. A method for channel communication, the method comprising using at least one hardware processor for:

receiving through a channel, using a decoder, a received sequence according to the method of claim 1, with an input being a probability sequence $y=(y^{(0)}, y^{(1)})$ with each bit of the received sequence of length n equals to 0, and an output being an estimated transmitted information sequence û;

calculating a probability sequence $\tilde{y}^{(0)}$ of an upper layer component code according to a superposition relationship of a partial sampler $\Pi$;

using $\tilde{y}^{(0)}$ as an input, calling a list decoding algorithm of a component code $C_0[n_0, k_0]$ with a list size of L, and obtaining L candidate information sequences $\hat{u}_l^{(0)}$ and their corresponding component codeword sequence $\hat{v}_l^{(0)}$ of length $n_0$, $l=0, 1, \ldots, L-1$;

for $l=0, 1, \ldots L-1$:

calculating a probability sequence $\tilde{y}_l^{(1)}$ of a lower layer component code according to $\Pi$;

using $\tilde{y}_l^{(1)}$ as an input, eliminating an influence of the upper layer component code, and decoding the lower layer component code $C_1[n_1, k_1]$ according to the coupling function S to obtain $\hat{u}_l^{(1)}$;

obtaining a candidate information sequence $\hat{u}_l=(\hat{u}_l^{(0)}, \hat{u}_l^{(1)})$; and calculating a likelihood function of each candidate information sequence, and outputting the candidate information sequence with the maximum likelihood.

7. The method according to claim 6, wherein for the probability sequence $\tilde{y}^{(0)}$ of the upper layer component code, the i-th component of $\tilde{y}_i^{(0)}$, $i=0, 1, \ldots, n_0-1$ is calculated as follows:

if the weight of the i-th column of $\Pi$ is 0, then $\tilde{y}_i^{(0)}=y_i^{(0)}$;

if the weight of the i-th column of $\Pi$ is 1, and the position of 1 is in line j, that is, $\Pi_{ji}=1$, then $\tilde{y}_i^{(0)}=y_i^{(0)}y_j^{(1)}+(1-y_i^{(0)})(1-y_j^{(1)})$, where $y_i^{(0)}$ represents the i-th component of $y^{(0)}$, and $y_j^{(1)}$ represents weights of the j-th component of $y^{(1)}$.

8. The method according to claim 6, wherein for the probability sequence $\tilde{y}_l^{(1)}$ of the lower layer component code, the i-th component $\tilde{y}_{l,i}^{(1)}$, $i=0, 1, \ldots, n_1-1$ is calculated as follows:

if the weight of the i-th row of $\Pi$ is 0, then $\tilde{y}_{l,i}^{(1)}=y_i^{(1)}$;

if the weight of the i-th row of $\Pi$ is $\rho_i>0$, that is, it has $\rho_i$ positions as 1, and these positions are $j_0, j_1, \ldots, j_{\rho_i-1}$, then $$\tilde{y}_{l,i}^{(1)} = y_i^{(1)} \boxplus D_{l,j_0} \boxplus \ldots \boxplus D_{l,j_{\rho_i-1}},$$

wherein, $$D_{l,j} = \begin{cases} y_j^{(0)}, & \hat{u}_{l,j}^{(0)} = 0 \\ 1-y_j^{(0)}, & \hat{u}_{l,j}^{(0)} = 1 \end{cases},$$

$\hat{u}_{l,j}^{(0)}$ represents the j-th component of $\hat{u}_l^{(0)}$, and wherein the operation $\boxplus$ is defined as:

$$a \boxplus b = \frac{ab}{ab+(1-a)(1-b)}.$$

9. The method according to claim 6, wherein, based on the coupling function S, the influence of the upper layer component code is eliminated, and the calculation method for decoding the lower layer component code $C_1[n_1, k_1]$ is:

substituting $\hat{u}_l^{(0)}$ into the coupling function S to obtain a sequence $s_l=S(\hat{u}_l^{(0)})$, and correcting $\tilde{y}_l^{(1)}$ according to $s_l$ to obtain $\hat{y}_l^{(1)}$:

$$\hat{y}_{l,j}^{(1)} = \begin{cases} \tilde{y}_{l,j}^{(1)}, & s_{l,j} = 0 \\ 1-\tilde{y}_{l,j}^{(1)}, & s_{l,j} = 1 \end{cases},$$

wherein $\hat{y}_{l,j}^{(1)}$, $\tilde{y}_{l,j}^{(1)}$, $s_{l,j}$ represent the j-th component of $\hat{y}_l^{(1)}$, $\tilde{y}_l^{(1)}$, $s_l$ respectively;

using the calculated $\hat{y}_l^{(1)}$ as the component code $C_1[n_1, k_1]$ of the called lower layer for decoding to obtain $\hat{u}_l^{(1)}$.

10. The method according to claim 6, wherein the calculation method for calculating the likelihood function of each candidate information sequence is:

re-encoding each candidate information sequence $\hat{u}_l$ to obtain an estimated codeword $\hat{c}_l$ to calculate its likelihood function $\lambda(\hat{c}_l)=\Pi_{i=0}^{n-1}[y_i+\hat{c}_{l,i}(1-2y_i)]$, where $y_i$ and $\hat{c}_{l,i}$ represent the i-th component of y and $\hat{c}_l$ respectively.

11. The method according to claim 6, wherein the candidate information sequence with the maximum likelihood is used as the output, and the decoding complexity is reduced by setting a threshold T, and when the calculated likelihood function exceeds the threshold, outputting $\hat{u}=\hat{u}_l$ then terminating the decoding process.

12. The method according to claim 6, wherein when the coupling function S is provided by using a polar code as a component code for the lower layer, and use a binary matrix P with a size of $k_0 \times (n_1-k_1)$ and a column weight of no more than 1, to obtain a sequence of length $n_1-k_1$: $f=u^{(0)}P$, so that $c^{(1)}$ is a polar codeword with f as frozen bits of the lower layer and $u^{(1)}$ as information bits;

the step of decoding the lower layer component code $C_1[n_1, k_1]$ is simplified to:

calculating frozen bits $f_l=\hat{u}_l^{(0)}P$, and then calling the decoder of the polar code $C_1[n_1, k_1]$ with $f_l$ as the frozen bits to decode to obtain $\hat{u}_l^{(1)}$.

13. An apparatus comprising a memory, a processor, and a computer program stored on the memory capable of running on the processor, characterized in that, the processor executes the computer program to implement the steps of the method according to claim 1.

14. A computer-readable medium with non-volatile program code executable by a processor, characterized in that, the program code causes the processor to execute the method according to claim 1.

* * * * *